United States Patent

[11] 3,559,855

[72] Inventors Jack R. Barnett
Baldwinsville;
Robert W. Brown, Liverpool; Francis C. Gantley, Fulton, N.Y.

[21] Appl. No. 800,535
[22] Filed Feb. 19, 1969
[45] Patented Feb. 2, 1971
[73] Assignee General Electric Company
Syracuse, N.Y.
a corporation of New York

[54] SHIMLESS SCRIBING
7 Claims, 4 Drawing Figs.

[52] U.S. Cl. .......... 225/2, 29/413, 53/21, 225/96.5
[51] Int. Cl. .......... B26f 3/00
[50] Field of Search .......... 225/2, 96, 96.5; 29/413; 53/21, 111

[56] References Cited

UNITED STATES PATENTS

| | | | |
|---|---|---|---|
| 2,970,730 | 2/1961 | Schwarz | 225/2 |
| 3,040,489 | 6/1962 | Da Costa | 53/21 |
| 3,206,088 | 9/1965 | Meyer et al. | 225/2 |
| 3,396,452 | 8/1968 | Sato et al. | 29/413 |
| 3,461,537 | 8/1969 | Lotz | 225/2X |

FOREIGN PATENTS

| | | | |
|---|---|---|---|
| 241,772 | 11/1962 | Australia | 225/2 |

*Primary Examiner*—Frank T. Yost
*Attorneys*—Robert J. Mooney, Nathan J. Cornfeld, Frank L. Neuhauser, Oscar B. Waddell and Joseph B. Forman

ABSTRACT: This invention relates to a method of subdividing a semiconductor wafer. Marks are scribed on a selected surface of the wafer along predetermined scribe passages thereby producing fracture loci under the marks. The wafer is then placed on a pad of resilient material. One surface is then covered with a thin sheet of flexible material capable of direct adhesion to the wafer that acts as a temporary pellet carrier. Next a compressive load is induced along the scribe marks by moving a compressive member in engagement with the covered surface of the wafer thereby fracturing the wafer into individual pellets such that they are individually adhered to the flexible sheet in essentially the same position they occupied in the parent wafer prior to the fracturing of the wafer.

INVENTORS:
JACK R. BARNETT,
ROBERT W. BROWN,
FRANCIS C. GANTLEY,

BY Robert J. Mooney
THEIR ATTORNEY.

SHIMLESS SCRIBING

This invention relates to an improved method of subdividing a semiconductor wafer into individual pellets.

The art of semiconductor device manufacturing has been burdened with many problems relating to the subdividing of semiconductor wafers individual pellets. Heretofore, the most commonly used subdividing method consisted of temporarily securing a wafer, using an adhesive wax, on a thin flexible metal support plate or shim, by techniques well known to those skilled in the art.

Once the shim-secured wafer is positioned, a diamond scriber is drawn across predetermined scribe passages on the wafer in order to form a plurality of rectangular shapes on the top surface of the wafer. The scribed wafer is then flexed on a curved support member in such a way that the wafer bends and fractures along the scribe passages. The wafer is next placed in an ultrasonic solvent bath to dissolve the wax and remove the individual pellets from the shim.

The major disadvantages of the shim-scribing method are (1) the wafer has to be secured on the shim, (2) the wax is often difficult to remove, (3) the subdivided pellets are difficult to sort and store, and (4) the pellets often break into sections consisting of more than one pellet rather than into single pellets as desired. All of there disadvantages result in less releasable devices and add to manufacturing costs.

Accordingly, one object of this invention is to provide a rapid method of subdividing a semiconductor wafer that reduces the mechanical damage done to the pellets during the subdividing process by eliminating the conventional use of a shim during the scribing portion of this process.

Another object of this invention is to provide a rapid method of subdividing a semiconductor wafer that provides a convent convenient means of storing the subdivided pellets without disturbing their original position in the parent wafer.

This invention may be better understood by reference to the following detailed e description considered in conjunction with the drawings, in which.

Briefly, in one aspect of this invention marks are scribed on a selected surface of a semiconductor wafer along predetermined scribe passages thereby producing fracture loci under the marks. The wafer is then placed on a pad of resilient material. One surface is then covered with a thin coherent sheet of flexible material capable of direct adhesion to the wafer that acts as a temporary pellet carrier. Next, a compressive load is induced along the scribe marks by moving a compressive member relative to the covered surface of the wafer thereby fracturing the wafer into individual pellets such that they are individually adhered to the flexible sheet in essentially the same position they occupied in the parent wafer prior to the fracturing of the wafer.

Figure 1:
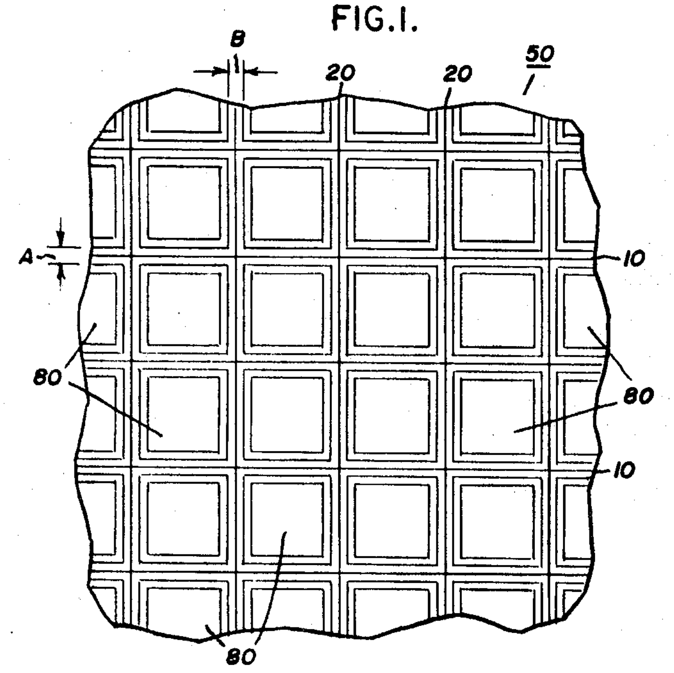
FIG. 1 is a top view of a portion of a semiconductor wafer to which this invention is particularly applicable.
Figure 2:
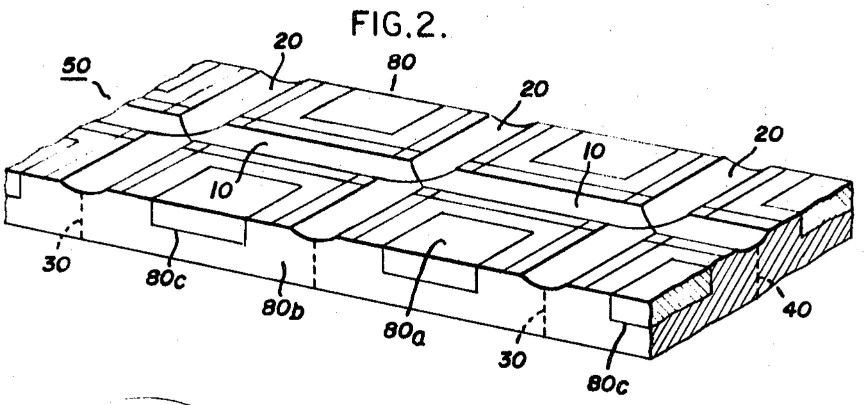
FIG. 2 is an enlarged isometric view of a section of the semiconductor wafer shown in FIG. 1.

In FIGS. 1 and 2 there is shown a top view of a portion of a semiconductor wafer 50. Formed in the wafer by diffusion and masking techniques well known to those skilled in the art are individual semiconductor devices 80. These devices 80 may be, for example, diodes, transistors, thyristors, integrated circuit devices or any combination thereof. As shown, the devices 80 in FIGS. 1 and 2 are PN junction diodes each comprising a P-type anode region 8 **80*a* which is formed in an N-type cathode substrate 80*b*, thus producing a PN junction 80*c*. The substrate 80*b* may be made of any conventional semiconductor material but is preferably silicon. Although not shown on wafer 50**, it is appreciated that any or all of the normal junction-covering and protective insulative layers as well as the contact electrodes whose composition and function are well understood by those skilled in the art, may be present on the waver surface concurrent with the practice of my invention.

A and B in FIG. 1 outline scribe passages formed on the wafer 50 by techniques well known to those skilled in the art and are used as guidelines during the scribing operation. The scribe marks 10 and 20 in FIGS. 1 and 2 represent the depressions (no semiconductor material is removed) made in the scribe passages A and B respectively of the wafer 50. The formation of these dents structurally weakens the wafer along predetermined planes under 10 and 20 during the scribing operation. Such planes are hereinafter also referred to as fracture loci. Generally, the scribe passages are surfaced with a protective insulative layer which may be, for example, silicon dioxide, and/or silicon nitride. When present, the dents 10 and 20 are formed in this layer. It is appreciated that there are other methods of structurally weakening the wafer to compression along these predetermined planes such as sawing, sand blasting, etc., which may be used in performing this invention. It is further appreciated that both the number and configuration of the scribe marks used and the resulting pellet shapes that they form can be varied from the exemplary rectilinear grid pattern shown.

The isometric view in FIG. 2 of wafer 50 illustrates the approximate location of the fracture loci as noted by the dash lines 30 and 40. It should also be noted that the semiconductor devices 80 are surrounded on all sides by the scribe marks 10 ad and 20.

Figure 3:
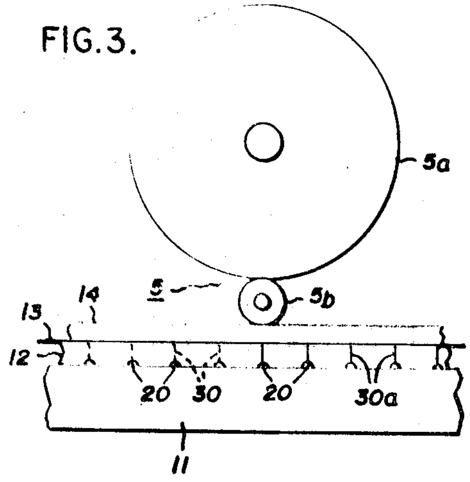
FIG. 3 is a schematic representation of an arrangement useful in performing this invention.

An approach useful in fracturing the wafer 12 along the fracture loci is schematically shown in FIG. 3. A pad 11 which is made of a resilient material such as silicone rubber, urethane rubber, natural rubber, or the like, is used as a base. The pad 11 acts both to hold the wafer 12 and to cushion it from excessive compressive stresses that may be applied to the wafer. Desirably, the hardness of this resilient material should be in the range of 20—85 durometers but more preferably between 6 60—70 durometers.

The semiconductor wafer 12 having first and second opposed major surfaces, one of which having been scribed, as shown in FIGS. 1 and 2, is covered on at least one of its major surfaces by a thin sheet 13 of a structurally coherent, flexible material. The flexible material is chosen to be directly adherent to the surface of the semiconductive material without the interposing of a separate adhesive or surface activator. Preferably the material is chosen to adhere on contact, although materials which directly adhere under compression may also be used, although they are less desirable. Suitable exemplary materials include polyvinylidene chloride, polyethylene, and polyvinylidene fluoride. Preferably, the flexible material should also be transparent for ease of observing the subdivided wafer covered by the flexible material and for this reason polyvinylidene chloride is particularly applicable to this invention. It should be noted that for some applications the wafer 12 can be placed in a thin-walled bag of flexible material 13 to allow for pellet storage. The covered wafer 12 is then preferably placed over covered side up onto the pad 11. It should also be noted that to minimize the ma amount of chipping of the pellet's edge it is preferred, but not essential, to place the scribed surface of the wafer 12 adjacent to the pad 11.

Figure 4:
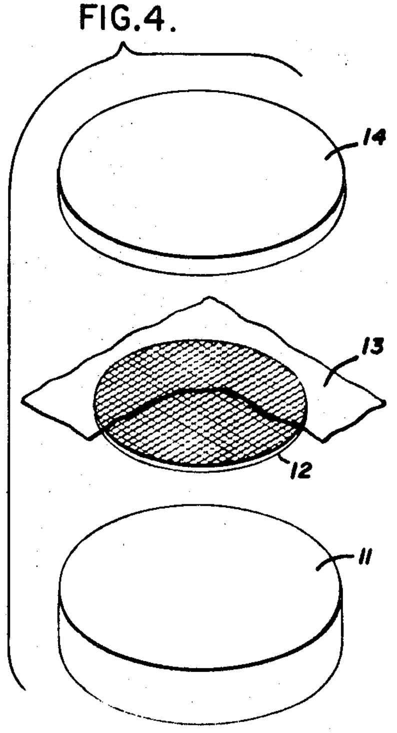
FIG. 4 is an exploded isometric view of a portion of the arrangement shown in FIG. 3.

A suitable compressive member 5 is then moved relative to the wafer 12 thereby providing, with the coacting pad, (which may be in turn supported by a rigid surface, not shown) a compressive load, to fracture the wafer 12 along the structurally weakened planes 30 and 40. Preferably, the compressive member 5 consists of two rollers **5*a* and 5*b* which may have the same or different diameters. One roller may also be used. It is, of course, recognized that other types and shaped shapes of compressive members capable of providing a compressive force can also be used. Further, the desired compressive force can be applied all at one time or in a series of applications. A disc 14** of a ductile, a nonadherent material such as polyethylene terephthalate, poly acrylic esters, cellulose acetate alkylate, etc., can be placed between the cover wafer 12 and the bottom roller 5b to prevent the thin sheet 13 from sticking to the roller 5b, should this occur. Alternately, the member used in applying compression may be formed of or coated with such a nonadherent material. Typically, the ductile material has a hardness between 75 and 95 durometers and preferably about 87 to 93 durometers. Also, for ease of processing it is preferred but not essential, that the disc 14 be transparent, thus the use of polyethylene terephthalate is particularly applicable. This latter arrangement is best illustrated in FIG. 4 where an exploded view is shown of the pad 11, the subdivided semiconductor wafer 12, the thin sheet 13 and the disc 14.

FIG. 3 also illustrates what happens to the scribed wafer 12 when the rollers 5a and 5b are moved relative to the covered surface. Moving from right to left as the rollers 5a and 5b pass over the disc 14, the scribed wafer 12 is pressed into the pad 11, thereby inducing compressive stresses in the area of the fracture loci 30a produced by the scribe marks 20, thereby fracturing the wafer along scribe passages B. It should be noted that when the rollers 5a and 5b are continued across the rest of the scribed wafer 12, the remainder of the scribe marks 20 and fracture loci 30 will be affected in the same manner.

Upon completion of the fracturing of scribe passages B the pad 11 and the wafer 12 may be rotated or indexed, if necessary, through an angle in the range of 5 to 90° but, generally about 90°. The compressive load is again applied as previously described in order to fracture along the scribe passages A. At this point the wafer 12 is completely subdivided into individual pellets which are individually adhered to the thin sheet 13 in the same relative position occupied thereby prior to the fracturing. Alternately, the wafer can be subdivided into any number of configurations including more than one pellet by varying the location of the scribe marks. It is also appreciated that the wafer 12 does not have to be indexed but instead the compressive force can be applied from a different angular direction.

In summary, this method of subdividing a semiconductor wafer is applicable to all types of pellet shapes and sizes using the basic procedures heretofore outlined with only slight modifications as previously noted.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

I claim:

1. A method of subdividing a wafer of a semiconductor material having first and second opposed major surfaces comprising the steps of:

structurally weakening the wafer by forming fracture loci along the first major surface which divide the wafer into a plurality of separable useful increments;

placing the second major surface of the wafer in contact with a flexible sheet of a material capable of direct adhesion to the semiconductor material; and placing the first major surface of the wafer against a coacting resilient support, placing a disc on the flexible sheet covering the second major surface of the wafer and contacting a compression member to the disc to bend the wafer against the support and cause the wafer to fracture along the predetermined structurally weakened major surface, the separate increments of the wafer thereby formed remaining adhered to said sheet in the same relative position which they occupied prior to fracturing.

2. A method of subdividing a wafer as recited in claim 1 wherein the step of placing the wafer on a pad includes the use of a resilient material exhibiting a hardness in the range of from 20 to 85 durometers.

3. A method of subdividing a wafer as recited in claim 1 where wherein the step of adhering is accomplished using as a sheet a flexible material which comprises at least one material from the group consisting of polyvinylidene chloride, polyethylene and polyvinylidene fluoride.

4. A method of subdividing a wafer as recited in claim 1 wherein the disc of ductile material comprised of at least one material from a group consisting of polyethylene terephthalate, poly acrylic esters, and cellulose acetate alkylate.

5. A method of subdividing a wafer as recited in claim 1 wherein the step of adhering is accomplished using as a sheet a flexible material which is transparent.

6. A method of subdividing a wafer of silicon semiconductor material having first and second major surfaces comprising the steps of:

forming at least one set of scribe marks on a selected surface of the wafer along predetermined scribe passages by moving a scribing tool relative to the wafer thereby producing fracture loci under the marks;

placing the wafer in a coherent bag of flexible material so that the bag adheres to at least one major surface of the wafer and acts as a temporary pellet carrier and storage container;

placing the bag containing the wafer on a pad of resilient material;

placing a disc of material exhibiting a hardness in the range of 75 to 95 durometers on top of the bag containing the wafer; and moving a compressive member relative to the one major surface over the disc and the coacting pad to fracture the wafer along the fracture loci and to subdivide the a wafer into individual pellets that are individually adhered to the flexible material in the same relative position occupied thereby prior to fracturing.

7. A method of subdividing a wafer of silicon semiconductor material having first and second major surfaces comprising the steps of:

forming at least one set of scribe marks on a selected surface of the wafer along predetermined scribe passages by moving a scribing tool relative to the wafer thereby producing fracture loci under the marks;

adhere adhering at least one major surface of the wafer to a coherent sheet of transparent polyvinylidene chloride which acts as a temporary pellet carrier;

placing the wafer on a pad of silicone rubber exhibiting a hardness of from 60 to 70 durometers;

placing a disc of polyethylene terephthalate exhibiting a hardness in the range of from 78 to 93 durometers between a compressive member and the coherent sheet; and moving a compressive member relative to the one major surface over the marks and the coat coacting silicone rubber pad to fracture the wafer along the fracture loci and to subdivide the wafer into individual pellets that are individually adhered to the sheet in the same relative position occupied thereby prior to fracturing.